US008481382B2

(12) United States Patent
Kitano et al.

(10) Patent No.: US 8,481,382 B2
(45) Date of Patent: Jul. 9, 2013

(54) METHOD AND APPARATUS FOR MANUFACTURING SEMICONDUCTOR DEVICE

(71) Applicant: Canon Anelva Corporation, Kawasaki (JP)

(72) Inventors: Naomu Kitano, Kawasaki (JP); Takuya Seino, Kawasaki (JP); Akira Matsuo, Kawasaki (JP); Yu Sato, Kawasaki (JP); Eitaro Morimoto, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/675,147

(22) Filed: Nov. 13, 2012

(65) Prior Publication Data

US 2013/0071975 A1    Mar. 21, 2013

Related U.S. Application Data

(63) Continuation of application No. PCT/JP2011/007292, filed on Dec. 27, 2011.

(30) Foreign Application Priority Data

Dec. 28, 2010  (JP) ................. 2010-294008

(51) Int. Cl.
*H01L 21/285* (2006.01)
*H01L 29/66* (2006.01)

(52) U.S. Cl.
USPC .......... 438/229; 438/287; 438/301; 438/585; 438/588; 257/E21.16

(58) Field of Classification Search
USPC ................................ 438/287, 588
See application file for complete search history.

(56) References Cited

U.S. PATENT DOCUMENTS 5,505,647 A    4/1996   Sato et al.
6,001,741 A   12/1999   Alers
(Continued)

FOREIGN PATENT DOCUMENTS

JP   10-195640 A    7/1998
JP   2000-3885 A    1/2000
(Continued)

OTHER PUBLICATIONS

International Search Report in International Application No. PCT/JP2011/007292, filed Dec. 27, 2011 (4 pages).

(Continued)

*Primary Examiner* — Angel Roman
(74) *Attorney, Agent, or Firm* — Fitzpatrick, Cella, Harper & Scinto

(57) ABSTRACT

The present invention provides a method and apparatus for manufacturing a semiconductor device using a PVD method and enabling achievement of a desired effective work function and reduction in leak current without increasing an equivalent oxide thickness. A method for manufacturing a semiconductor device in an embodiment of the present invention includes the steps of: preparing a substrate on which an insulating film having a relative permittivity higher than that of a silicon oxide film is formed; and depositing a metal nitride film on the insulating film. The metal nitride depositing step is a step of sputtering deposition in an evacuable chamber using a metal target and a cusp magnetic field formed over a surface of the metal target by a magnet mechanism in which magnet pieces are arranged as grid points in such a grid form that the adjacent magnet pieces have their polarities reversed from each other.

8 Claims, 10 Drawing Sheets

U.S. PATENT DOCUMENTS

| | | |
|---|---|---|
| 7,857,946 B2 | 12/2010 | Kitano et al. |
| 7,867,847 B2 | 1/2011 | Kitano et al. |
| 7,923,360 B2 | 4/2011 | Kitagawa et al. |
| 8,012,822 B2 | 9/2011 | Kitano et al. |
| 8,030,694 B2 | 10/2011 | Nakagawa et al. |
| 8,053,311 B2 | 11/2011 | Nakagawa et al. |
| 8,088,678 B2 | 1/2012 | Kitano et al. |
| 8,148,275 B2 | 4/2012 | Fukuchi et al. |
| 8,178,934 B2 | 5/2012 | Kitano et al. |
| 8,231,767 B2 | 7/2012 | Iori et al. |
| 8,232,189 B2 | 7/2012 | Ono et al. |
| 8,278,211 B2 | 10/2012 | Hirayama et al. |
| 8,288,234 B2 | 10/2012 | Seino et al. |
| 8,303,785 B2 | 11/2012 | Tanaka et al. |
| 2001/0030123 A1* | 10/2001 | Fu et al. .................. 204/192.15 |
| 2007/0212895 A1 | 9/2007 | Chua et al. |
| 2011/0121927 A1 | 5/2011 | Iori et al. |
| 2011/0165775 A1 | 7/2011 | Hirayama et al. |
| 2011/0210405 A1 | 9/2011 | Nakagawa et al. |
| 2012/0161322 A1 | 6/2012 | Wakayanagi et al. |

FOREIGN PATENT DOCUMENTS

| | | |
|---|---|---|
| JP | 2000-353674 A | 12/2000 |
| JP | 2001-152332 A | 6/2001 |
| JP | 2009-529789 A | 8/2009 |
| JP | 2010-90424 A | 4/2010 |
| WO | 2009/157186 A1 | 12/2009 |
| WO | 2010/004890 A1 | 1/2010 |

OTHER PUBLICATIONS

Sakashita, S., et al., "Low Temperature Divided CVD Technique for TiN Metal Gate Electrodes of p-MISFETs", Ext. Abstracts of the 2005 International Conference on Solid State Devices and Materials, pp. 854-855 (2005).

Kawahara, T., et al. "Effect of Hf Sources, Oxidizing Agents, and $NH_3$/Ar Plasma on the Properties of HfAlOx Films Prepared by Atomic Layer Deposition", Jpn. J. Appl. Phys. 43, No. 7A, pp. 4129-4134 (2004).

Nakajima, K., et al., "Work Function Controlled Metal Gate Electrode on Ultrathin Gate Insulators" Symp. VLSI Technology Digest of Technical Papers, p. 95-96 (1999).

* cited by examiner

METHOD AND APPARATUS FOR MANUFACTURING SEMICONDUCTOR DEVICE

CROSS-REFERENCES TO RELATED APPLICATIONS

This application is a continuation application of International Application No. PCT/JP2011/007292, filed Dec. 27, 2011, which claims the benefit of Japanese Patent Application No. 2010-294008, filed Dec. 28, 2010. The contents of the aforementioned applications are incorporated herein by reference in their entireties.

BACKGROUND OF THE INVENTION

1. Field of the Invention

The present invention relates to a method and apparatus for manufacturing a semiconductor device including a high-permittivity insulating film and a metal gate electrode. The present invention particularly relates to technology for enhancing performance of MOSFETs (Metal Oxide Semiconductor Field Transistor).

2. Description of the Related Art

Advanced CMOS (complementary MOS) device development with increasing miniaturization of transistors faces problems of a deterioration of drive current due to a depletion of a polysilicon (Poly-Si) electrode and an increase in gate current due to the thinning of a gate insulating film. To cope with these, studies are in progress on combined technology for achieving both the prevention of the depletion of the electrode by employing a metal gate and the reduction in gate leak current by forming the gate insulating film with a larger physical film thickness using a high-permittivity material. Pure metals, metal nitrides, silicide materials, and the like are studied as a material for the metal gate electrode. Whichever material is used, the threshold voltages (Vth) of n-type MOSFETs and p-type MOSFETs need to be settable at their proper values. When a transistor uses a conventional gate electrode of a polycrystalline silicon film, the threshold voltage of the transistor is determined by the impurity concentration in a channel region and the impurity concentration in the polycrystalline silicon film. On the other hand, when a transistor uses a metal gate electrode, the threshold voltage of the transistor is determined by the impurity concentration in a channel region and the work function of the gate electrode. To manufacture CMOS transistors with a Vth of ±0.5 V or smaller, the gate electrode for n-type MOSFETs needs to use a material having a work function of the mid-gap of Si (4.6 eV) or lower, desirably 4.4 eV or lower, and the gate electrode for p-type MOSFETs needs to use a material having a work function of the mid-gap of Si (4.6 eV) or higher, desirably 4.8 eV or higher. A CVD (Chemical Vapor Deposition) method, a PVD (Physical Vapor Deposition) method, or the like is used as means for forming such metal gate electrodes.

A description will be provided here of an example of a method of forming a metal gate electrode using the CVD method. Non-patent Document 1 uses the CVD method to form a metal gate electrode and succeeds in achieving a high effective work function (5.1 eV) and good leak current (Jg) characteristics relative to an equivalent oxide thickness (EOT). However, it is conceivable that transistor characteristics deteriorate due to impurities contained in a material of the electrode, as shown in Non-patent Document 2. On the other hand, the PVD method possibly causes a smaller amount of impurities to be mixed in the material than the CVD method does, but has problems that the leak current characteristics deteriorate and a desired effective work function cannot be obtained unlike the CVD method, as shown in Non-patent Document 3. To address these problems, Patent Document 1 reports that leak current characteristics are improved by forming an electrode having a laminate structure of metal nitride and metal with nitriding of a surface portion of an insulating film (oxide) by a DC sputtering method. However, this method is becoming inadequate with advancement of the miniaturization of transistors (a gate length of 32 nm or smaller).

PRIOR ART LITERATURE

Patent Literature 1: Japanese Patent Laid-open Publication No. 2000-353674

Non-patent Literature 1: S. Sakashita et al., "Low temperature divided CVD technique for TiN metal gate electrodes of p-MISFETs" Ext. Abstracts. International Conference on Solid State Devices and Materials, 2005, pp. 854-858.

Non-patent Literature 2: T. Kawahara et al., "Effect of Hf Sources, Oxidizing Agents, and $NH_3$/Ar Plasma on the Properties of HfAlOx Films Prepared by Atomic Layer Deposition" Jpn. J. Appl. Phys. 43 No. 7A (2004) 4129-4134.

Non-patent Literature 3: K. Nakajima et al., "Work Function Controlled Metal Gate Electrode on Ultrathin Gate Insulators" Symp. VLSI Tech, 1999

SUMMARY OF THE INVENTION

An objective of the present invention is to provide a method and apparatus for manufacturing a semiconductor device which use the PVD method and make it possible to achieve a desired effective work function and reduce leak current without increasing equivalent oxide thickness.

In order to achieve the objective described above, a first aspect of the present invention is a method for manufacturing a semiconductor device comprising the steps of: preparing a substrate on which an insulating film having a relative permittivity higher than that of a silicon oxide film is formed; and depositing a metal nitride film on the insulating film, wherein the step of depositing the metal nitride film is a step of sputtering deposition in an evacuatable process chamber by use of a metal target and a cusp magnetic field formed over a surface of the metal target by a structure in which a plurality of magnet pieces are arranged as grid points in such a grid form that adjacent two of the magnet pieces have their polarities reversed from each other, wherein the metal nitride film is formed by introducing a gas containing a nitrogen gas into the process chamber and forming plasma of the nitrogen by the cusp magnetic field.

A second aspect of the present invention is a method for manufacturing a semiconductor device comprising the steps of: forming a high-permittivity insulating film on a semiconductor substrate; forming a first metal nitride layer on the high-permittivity insulating film; forming a silicon layer on the first metal nitride layer; forming a source region and a drain region in the semiconductor substrate with at least the high-permittivity insulating film, the first metal nitride layer, and the silicon layer used as a mask; forming an interlayer insulating film on the semiconductor substrate in which the source region and the drain region are formed, and then removing part of the interlayer insulating film thereby to expose the silicon layer; removing the silicon layer over the high-permittivity insulating film and thereby forming a trench structure; and forming a second metal nitride layer in such a way as to cover an inside of the trench structure, wherein at least one of the step of forming the first metal nitride layer and the step of forming the second metal nitride layer is a step of sputtering deposition in an evacuatable process chamber by use of a metal target and a cusp magnetic field formed over a surface of the target by a structure in which a plurality of magnet pieces are arranged as grid points in such a grid form that adjacent two of the magnet pieces have their polarities reversed from each other, wherein the metal nitride film is formed by introducing a gas containing a nitrogen gas into the process chamber and forming plasma of the nitrogen by the cusp magnetic field.

A third aspect of the present invention is a method for manufacturing a semiconductor device comprising the steps of: forming a high-permittivity insulating film on a semiconductor substrate in a region for forming a first MOS transistor and a region for forming a second MOS transistor having a conductivity type opposite to that of the first MOS transistor; forming a metal nitride layer and a silicon layer sequentially on the high-permittivity insulating film; forming source regions and drain regions in the semiconductor substrate with at least the high-permittivity insulating film, the metal nitride layer, and the silicon layer used as a mask; forming an interlayer insulating film on the semiconductor substrate in which the source regions and the drain regions are formed, and then removing part of the interlayer insulating film thereby to expose the silicon layer; removing the silicon layer over the high-permittivity insulating film and thereby forming trench structures; forming a tantalum nitride film and a titanium nitride film sequentially in such a way as to cover insides of the trench structures; removing part of the titanium nitride film and the tantalum nitride film covering a bottom portion of the trench structure in the region for forming the first MOS transistor; forming an alloy layer containing titanium and aluminum in such a way as to cover the insides of the trench structures; and forming an aluminum film on the alloy layer in such a way as to fill the insides of the trench structures, wherein at least one of the metal nitride layer, the titanium nitride film, and the tantalum nitride film is formed by a sputtering method which is carried out with a gas containing nitrogen being introduced into an evacuatable process chamber, by use of a metal target, a cusp magnetic field formed over a surface of the target by a structure in which a plurality of magnet pieces are arranged as grid points in such a grid form that adjacent two of the magnet pieces have their polarities reversed from each other, and plasma of the nitrogen formed by the cusp magnetic field.

A fourth aspect of the present invention is an apparatus for forming a metal nitride layer comprising: an evacuatable process chamber; a first electrode provided in the process chamber and being capable of holding a metal target; a second electrode having a substrate holder capable of holding a substrate; a gas introducing nozzle configured to introduce a gas containing nitrogen into the process chamber; a magnet mechanism in which a plurality of magnet pieces are arranged as grid points in such a grid form that adjacent two of the magnet pieces have their polarities reversed from each other, the magnet mechanism configured to form a cusp magnetic field over a surface of the target when the target is placed on the first electrode; a DC power supply connected to the first electrode; a first high-frequency power supply configured to supply the first electrode with high-frequency power on which a direct-current voltage from the DC power supply is superimposed; and a second high-frequency power supply configured to supply high-frequency power to the second electrode.

The present invention makes it possible to achieve a desired effective work function and improve leak current characteristics without increasing EOT.

DESCRIPTION OF THE PREFERRED EMBODIMENT

Figure 1:
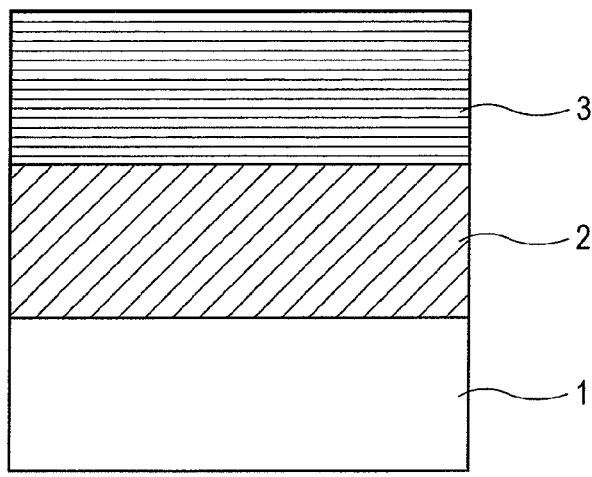
FIG. 1 is a view showing a cross section of the structure of an element according to an embodiment of the present invention.

A description will be given of an embodiment of a metal nitride film according to the present invention which makes it possible to achieve a desired effective work function and improve the leak current characteristics corresponding to EOT, while a MIS (Metal Insulator Semiconductor structure) capacitor element of FIG. 1 is taken as an example.

As shown in FIG. 1, a titanium nitride film 3 serving as a gate electrode is formed on a p-type silicon substrate 1 having, in its top surface, a silicon oxide film and a HfSiO film 2 which is a high-permittivity film serving as a gate insulating film.

A high-permittivity material to be used as the gate insulating film is a material having a relative permittivity higher than that of $SiO_2$ (3.9). Examples of such material include metal oxides, metal silicates, nitrogen-introduced metal oxides, and nitrogen-introduced metal silicates. A nitrogen-introduced high-permittivity film is preferable as a gate insulating film in terms of suppressing crystallization of the gate insulating film and thereby improving reliability of an element. Hf or Zr is preferable as metal contained in the high-permittivity material in terms of the heat resistance property of the film and suppression of fixed charges inside the film. In addition, as the high-permittivity material, a metal oxide containing Hf or Zr and Si, or a metal oxynitride made by further adding nitrogen to the metal oxide is preferable, and HfSiO or HfSiON is more preferable. Further, although a silicon oxide film and a high-permittivity film stacked thereon are used as a gate insulating film in this embodiment, the gate insulating film is not limited to this; alternatively, a high-permittivity insulating film may be solely used, or a silicon oxynitride film and a high-permittivity film stacked thereon may be used.

Furthermore, it is preferable that a metal nitride film serving as a gate electrode contain one or at least two of metal elements selected from the group consisting of Ti, Ta, W, and Al.

Figure 2:
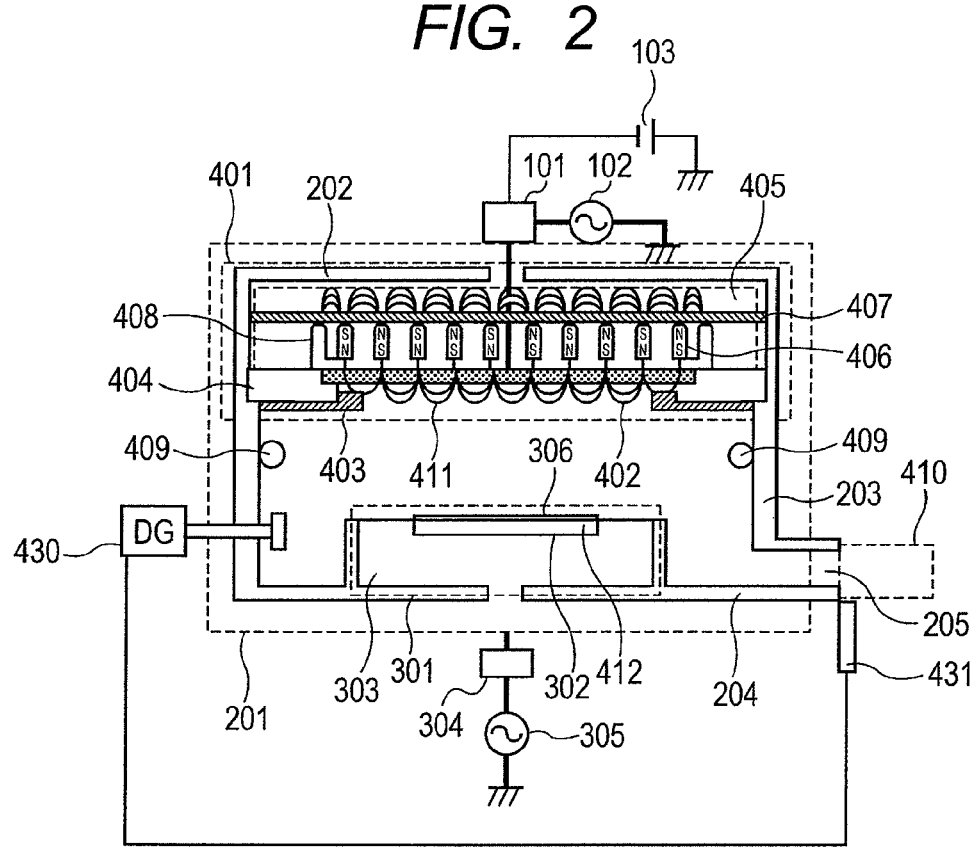
FIG. 2 is a schematic view showing a processing apparatus to be used in a process of forming a metal nitride film according to the embodiment of the present invention.

FIG. 2 is a schematic view showing an apparatus to be used in a process of forming the titanium nitride film according to the embodiment of the present invention. As shown in FIG. 2, a semiconductor manufacturing apparatus 100 according to the embodiment of the present invention includes a chamber 201 having an upper electrode 401 and a lower electrode 301. The chamber 201 serves as a vacuum processing container, and has an exhaust port 205 which is connected to a vacuum exhaust pump 410 configured to exhaust the air in the chamber 201 and which is provided with an automatic pressure controller (APC) 431. In addition, the upper electrode 401 and the lower electrode 301 are provided in the chamber 201. An upper-electrode high-frequency power supply 102 and a DC power supply 103 are connected to the upper electrode 401 via a matching box 101. A lower-electrode high-frequency power supply 305 is connected to the lower electrode 301 via a matching box 304.

The chamber 201 is substantially columnar, and includes a substantially disc-shaped upper wall (ceiling wall) 202, a substantially cylindrical sidewall 203, and a substantially disc-shaped bottom wall 204. A pressure gauge 430 (a diaphragm gauge, for example) configured to measure a pressure is provided near the sidewall 203 in the chamber 201. The pressure gauge 430 is electrically connected to the automatic pressure controller 431, and configured to automatically control the pressure inside the chamber 201.

The upper electrode 401 includes the upper wall 202, a magnet mechanism 405, a target electrode (a first electrode) 402, an insulator 404, and a shield 403. The magnet mechanism 405 is provided below the upper wall 202, and the target electrode 402 is provided below the magnet mechanism 405. In addition, the insulator 404 is designed to insulate the target electrode 402 and the sidewall of the chamber 201 from each other as well as to hold the target electrode 402 inside the chamber 201. Moreover, the shield 403 is provided below the insulator 404. Incidentally, the target electrode 402 is connected to the upper-electrode high-frequency power supply 102 and the DC power supply 103 via the matching box 101. Main parts of the target electrode 402 contain nonmagnetic metal such as Al, SUS, and Cu. A target material (not illustrated) necessary to form a film on a substrate 306 may be placed on the target electrode 402 on the vacuum side. Further, piping is formed in the upper electrode 401 and the target electrode 402. The upper electrode 401 and the target electrode 402 can be cooled by letting coolant flow through the piping.

As the target described above, it is possible to use a target containing one or at least two of metal elements selected from the group consisting of Ti, Ta, W, and Al, for example.

The magnet mechanism 405 includes: a magnet supporting plate 407; multiple magnet pieces 406 supported by the magnet supporting plate 407; and a magnetic-field adjusting magnetic body 408 placed at the outermost peripheral side of the multiple magnet pieces 406. Note that the magnet mechanism 405 is rotatable by an unillustrated rotation mechanism about the central axis of the target material. The multiple magnet pieces 406 are arranged adjacent to each other and in parallel with a surface of the target electrode 402 above the target electrode 402. A closed point-cusp magnetic field 411 is formed by the adjacent magnet pieces 406 to confine plasma. The magnetic-field adjusting magnetic body 408 is extended to partially overlap the target electrode 402 sides of the magnet pieces 406 located on the outer peripheral side. With this configuration, the magnetic field strength in the gap between the target electrode 402 and the shield 403 can be reduced (controlled).

The lower electrode 301 includes: a stage holder 302; a cooling/heating mechanism 412; the bottom wall 204; and a second-electrode insulator 303. The stage holder 302 is a device to place the substrate 306 thereon, and the cooling/heating mechanism 412 is provided inside the stage holder 302. The second-electrode insulator 303 is a device to electrically insulate the stage holder 302 and the bottom wall 204 of the chamber 201 from each other and support them. In addition, the lower-electrode high-frequency power supply 305 is connected to the stage holder 302 via the matching box 304. Note that, although not illustrated, an electrostatic adsorption device having a unipolar electrode is provided to the stage holder 302, and the unipolar electrode is connected to a DC power supply (not illustrated); and that, although not illustrated, multiple gas ejecting nozzles and a substrate-temperature gauge to measure a substrate temperature are provided to the stage holder 302 in order to supply the back surface of the substrate 306 with a gas (an inert gas such as Ar, for example) to control the temperature of the substrate 306.

Multiple gas introducing nozzles 409 to supply a given gas, e.g., a process gas such as argon, to the inside of the chamber 201 are provided in the chamber 201.

Figure 3:
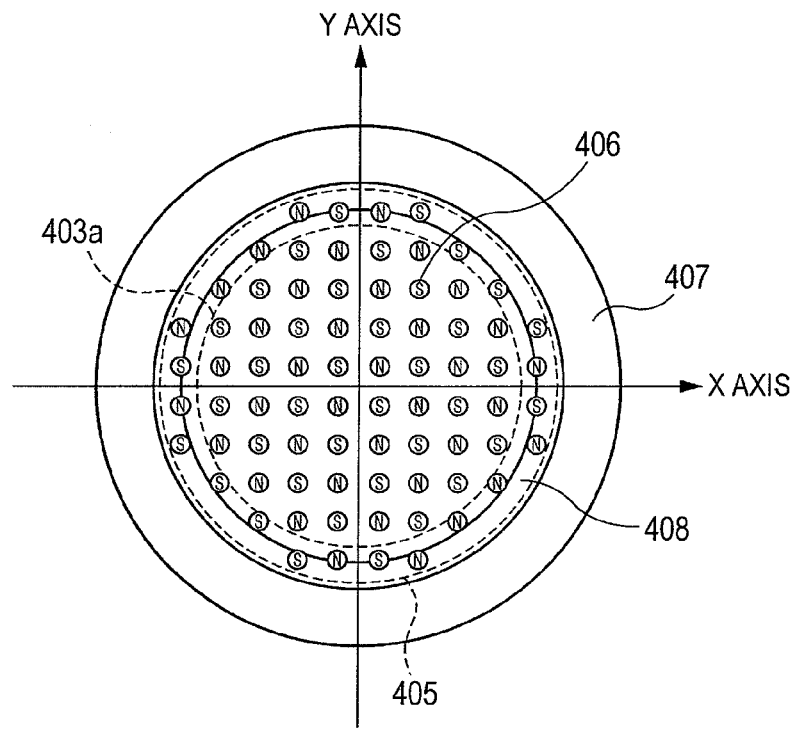
FIG. 3 is a plan view showing a magnet mechanism according to the embodiment of the present invention viewed from a target electrode (a first electrode) side.

The shape of the magnet mechanism 405 will be described in detail with reference to FIG. 3. FIG. 3 is a plan view of the magnet mechanism 405 viewed from the target electrode 402 side. As shown in FIG. 3, the annular magnetic-field adjusting magnetic body 408 and the magnet pieces 406 placed in an inner peripheral region of the magnetic-field adjusting magnetic body 408 are supported by the magnet supporting plate 407. Here, in FIG. 3, reference numeral 403a indicates the inner diameter of the shield 403, and multiple small circles indicate the outlines of the respective magnet pieces 406. Further, the magnet pieces 406 have the same shape and the same magnetic flux density. Furthermore, the letters N and S indicate poles of the magnet pieces 406 viewed from the target electrode 402 side.

The multiple magnet pieces 406 are arranged at substantially uniform intervals (in a range between 5 mm and 100 mm) in the form of a tetragonal grid (in the X direction and in the Y direction) in such a way as to respectively constitute grid points, and adjacent two magnet pieces 406 have their polarities reversed from each other. On the other hand, in a tetragon formed by any four magnet pieces 406 arranged in the X direction and in the Y direction, every two magnet pieces 406 adjacent in a diagonal direction have the same polarity. In other words, any four magnet pieces 406 adjacent to one another form the point-cusp magnetic field 411. Incidentally, the magnet pieces 406 may be arranged in the form of hexagonal grids or any other shape as long as they form unit grids.

Each magnet piece 406 has a height normally larger than 2 mm, and has a tetragonal or circular cross-section. The diameter, height, and material of the magnet piece 406 may be set appropriately according to the process application. Upon supply of high-frequency power to the upper electrode 401 of the semiconductor manufacturing apparatus 100, plasma is generated by the capacitive coupling mechanism. The closed point-cusp magnetic field 411 acts on the generated plasma. To put it differently, since employing a configuration to generate the point-cusp magnetic field 411, the embodiment of the present invention enables formation of plasma of higher density than that formed by ordinary magnetron sputtering.

The magnetic-field adjusting magnetic body 408 is provided in an extending manner to partially overlap, on the target electrode 402 side, the magnet pieces 406 located on the outer peripheral side. With this configuration, the magnetic field strength in the gap between the target electrode 402 and the shield 403 can be reduced (controlled). The magnetic-field adjusting magnetic body 408 may be made of any material as long as the material can control the magnetic field strength in the gap between the target electrode 402 and the shield 403. For example, a material of high magnetic permeability, such as SUS430, is preferable. The magnetic field in the magnet mechanism 405 is adjustable by adjusting the area by which the magnet pieces 406 and the magnetic-field adjusting magnetic body 408 overlap. In other words, the adjustment of the area by which the magnet pieces 406 and the magnetic-field adjusting magnetic body 408 overlap makes it possible to supply a magnetic field necessary to sputter the entire target electrode 402 including its outermost periphery, and to adjust the magnetic field strength in the gap between the target electrode 402 and the shield 403.

In the embodiment of the present invention, a Ti metal target is used as the target; a substrate temperature is set at 30° C.; Ti target power is set at 1500 W; and a DC voltage to be superimposed on the high-frequency power is set at 350 V. With Ar being used as an inert gas, the amount of Ar to be supplied being set at 70 sccm (Standard Cubic Centimeter per Minutes), and the amount of a nitrogen-containing reactive gas to be supplied being set at 30 sccm, an Ar gas and a nitrogen-containing reactive gas are supplied through the gas introducing nozzles 409, the pressure of these gases is adjusted to 20 Pa, and thereafter the TiN film 3 is deposited with a thickness of 10 nm. Note that, sccm=the volume flow rate of gas to be supplied per minute at 0° C. and 1 atmosphere represented by cubic centimeters=$1.69 \times 10^{-3}$ Pa·m$^3$/s (at 0° C.). Here, the frequency of the high-frequency power is preferably in a range of 10 MHz to 100 MHz, and more preferably in a range of 40 MHz to 60 MHz in order to form high-density plasma by use of the point-cusp magnetic field under the above pressure.

Next, the lithography technology and the RIE (Reactive Ion Etching) technology are used to process the TiN film 3 into a desired size and to thereby form an element.

Figure 4:
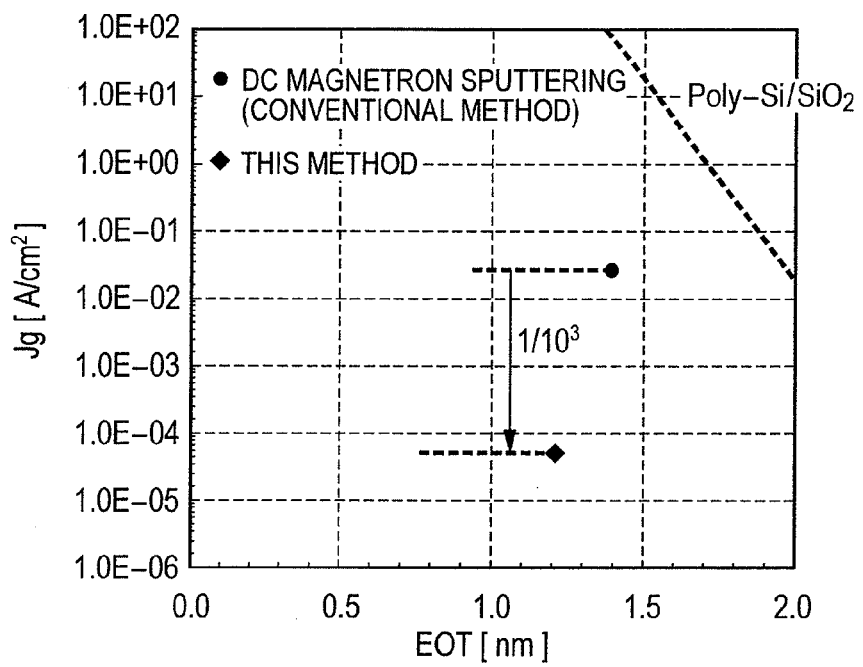
FIG. 4 is a graph showing the relationship between EOT and leak current of the element according to the embodiment of the present invention.
Figure 5:
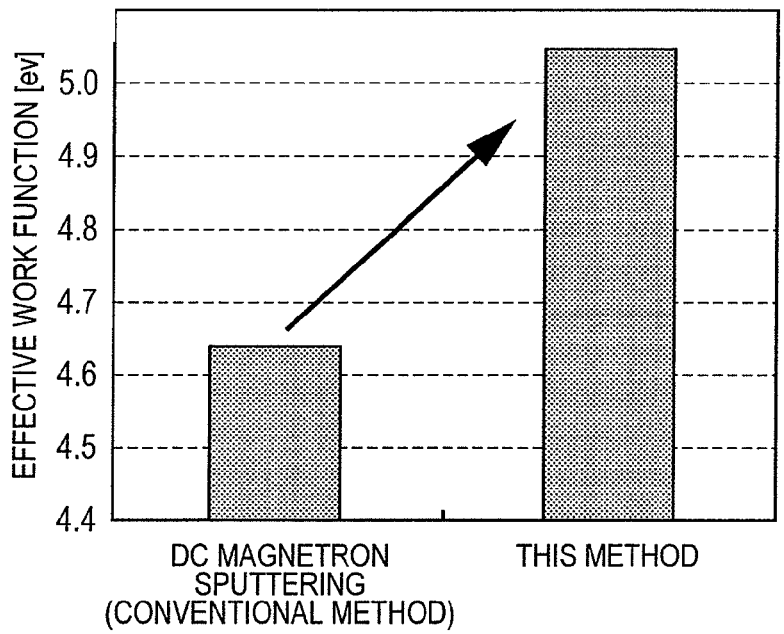
FIG. 5 is a graph showing a value of an effective work function of the element according to the embodiment of the present invention.

Subsequently, electric characteristics such as EOT, leak current (Jg) characteristics, and effective work function were evaluated by C-V measurement and I-V measurement. In this respect, the effective work function is generally found from a flat band obtained by the C-V measurement on a gate insulating film and a gate electrode, and is affected by fixed charges in the insulating film, dipoles formed in the interface, Fermi level pinning, and the like in addition to the work function of the gate electrode itself. Hence, the effective work function is different from the "work function" of the material itself constituting the gate electrode. FIGS. 4 and 5 show results obtained by measuring electric characteristics of an element including the TiN electrode formed by the embodiment of the present invention. Here, the electric characteristics were evaluated in an as-deposited state. In this respect, the "as-deposited state" denotes a state where the TiN electrode has been formed. FIG. 4 shows EOT-Jg characteristics of the TiN electrode formed by the embodiment of the present invention and of a TiN electrode formed by DC magnetron sputtering (hereinafter referred to as a conventional method). It can be confirmed from FIG. 4 that the leak current (Jg) of the TiN electrode formed by the embodiment of the present invention is reduced by approximately triple-digit figures as compared with that of the TiN electrode formed by the conventional method. Next, FIG. 5 shows values of the effective work function of the TiN electrode formed by the conventional method and that of the TiN electrode formed by the embodiment of the present invention. It can be understood from FIG. 5 that the effective work function of an element having the TiN electrode formed by the conventional method is 4.6 eV, whereas the effective work function of the element having the TiN electrode formed by the embodiment of the present invention shows a high value of 5.0 eV or higher. Such value of the effective work function is suitable for p-type MOSFETs.

Figure 6:
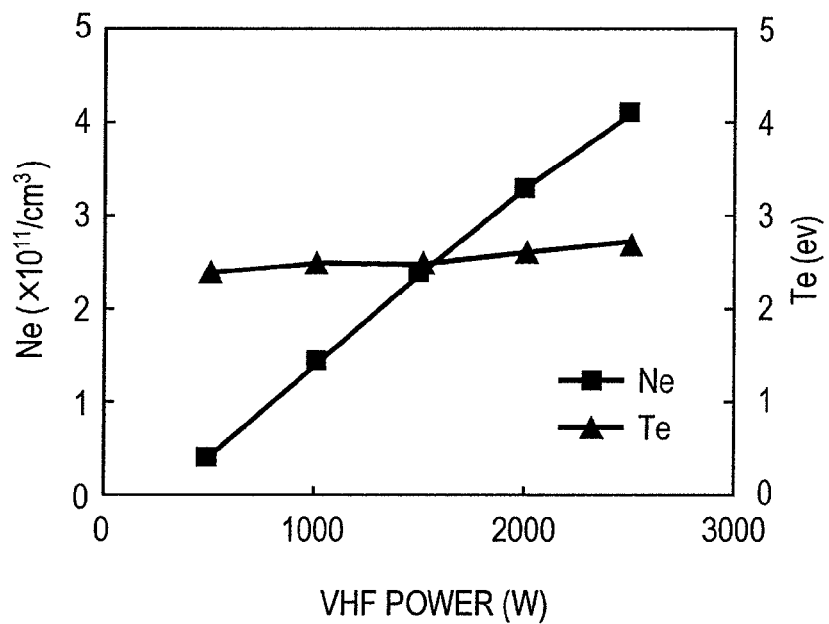
FIG. 6 is a graph showing the relationship between plasma density and electron temperature of the processing apparatus according to the embodiment of the present invention.

FIG. 6 shows the relationship between plasma density and electron temperature corresponding to the power applied to the target electrode 402, at a position near the substrate in the magnetic field generated by the magnet mechanism 405 shown in FIG. 3. It can be understood from FIG. 6 that, when the power applied to the target electrode 402 is 1500 W, the electron temperature is around 2.5 eV while the plasma density is $1 \times 10^{11}$/cm$^3$ or higher. Nitrogen ions or nitrogen radicals formed by the high-density plasma are incident on a High-k film efficiently, so that the High-k film is reformed.

This phenomenon is considered to enable improvement in leak current without increasing in EOT. In other words, according to the embodiment of the present invention, since PVD is carried out by using the magnet mechanism 405 configured to generate the point-cusp magnetic field 411, nitrogen ions or nitrogen radicals can be incident on the High-k film efficiently, which makes it possible to reduce leak current without increasing EOT.

Further, the point-cusp magnetic field 411 is formed by the magnet pieces which are arranged at positions corresponding to the respective corners of tetragons arranged continuously in the form of a grid and which are arranged in such a way that every two magnet pieces of each tetragon adjacent to each other in a side direction have their polarities reversed from each other, and the magnitude of the magnetic field 411 is fixed according to the magnet pieces 406 arranged. However, according to the embodiment of the present invention, since high-frequency power is applied to the target electrode 402, it is possible to change plasma density by the action of the high-frequency electric field even in the point-cusp magnetic field 411 which is a fixed magnetic field, as shown in FIG. 6.

Furthermore, as a result of evaluating the relationship between the sputtering yield of a Ti target and the volume flow rates of argon being an inert gas and of nitrogen being a reactive gas, it was confirmed that the lowering rate of the sputtering yield caused by nitriding of the target surface was maximum in a region where nitrogen volume flow rate/(nitrogen volume flow rate+argon volume flow rate) was 0.05 or higher.

The above verification shows that improved EOT-Jg characteristics and a desired effective work function can be obtained by the element having the TiN electrode formed by the embodiment of the present invention. Although the TiN film formed under conditions of nitrogen/(nitrogen+argon) =0.3 and 20 Pa was used in the embodiment, the film is not limited to this; but the TiN film formed under conditions where the pressure is in a range between 2 Pa and 100 Pa and nitrogen/(nitrogen+argon) is 0.05 or higher can exert its effect sufficiently. If the pressure is 2 Pa or smaller, the leak current deteriorates; meanwhile, if the pressure is 100 Pa or larger, the leak current improves, but film-formation speed drastically decreases and thus the mass production performance is deteriorated.

FIRST EXAMPLE

Figure 7A:
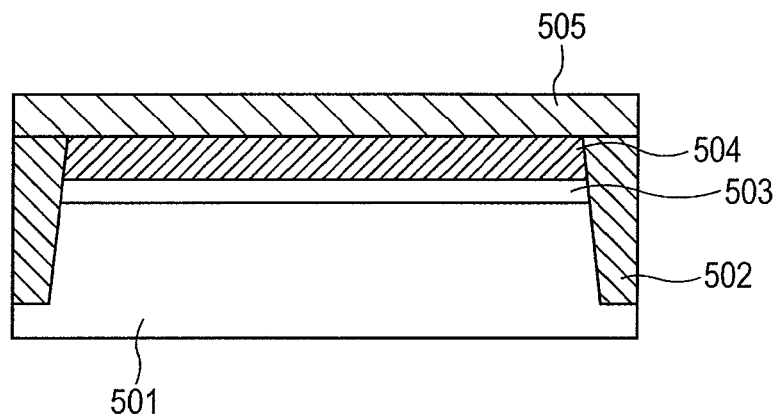
FIG. 7A is a view showing a process of manufacturing a semiconductor device according to a first example of the present invention.
Figure 7B:
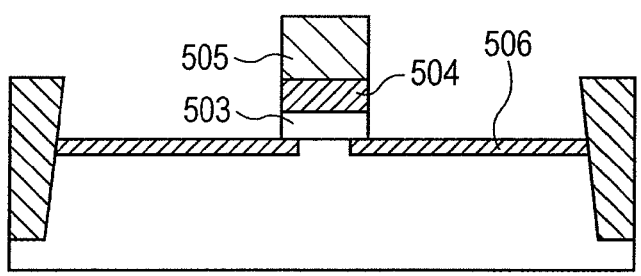
FIG. 7B is a view showing the process of manufacturing a semiconductor device according to the first example of the present invention.
Figure 7C:
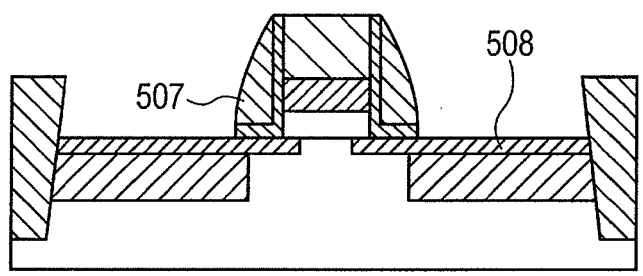
FIG. 7C is a view showing the process of manufacturing a semiconductor device according to the first example of the present invention.
Figure 8:
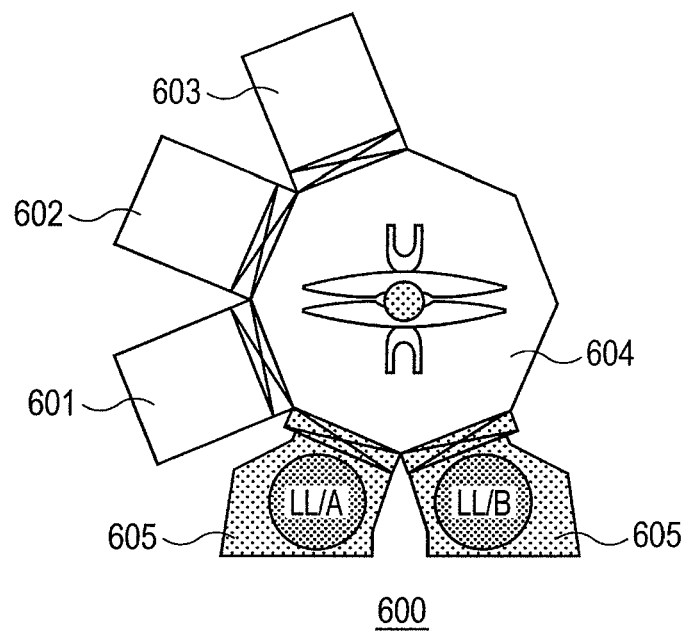
FIG. 8 is a schematic view showing a device for carrying out part of the process of the first example of the present invention.

A first example of the present invention will be described in detail with reference to the drawings. FIGS. 7A to 7C are diagrams showing a process of a method for manufacturing a semiconductor device according to the first example of the present invention. First, as shown in FIG. 7A, an element isolation region 502 formed by the STI (Shallow Trench Isolation) technology was provided on a surface of a silicon substrate 501. Subsequently, a silicon thermally-oxidized film of 1.0 nm thickness was formed by a thermal oxidation method on the surface of the silicon substrate 501 subjected to element isolation. Then, the silicon substrate 501 was put in a cluster tool 600 shown in FIG. 8. In FIG. 8, the silicon substrate 501 was first delivered from a road lock chamber 605 to a chamber 601, and then Hf of 0.5 nm to 0.7 nm thickness was deposited on the silicon substrate 501 by a sputtering method. Next, the silicon substrate 501 on which Hf was formed was delivered to a chamber 602 through a transfer chamber 604 without letting the substrate get exposed to the atmosphere, and was then subjected to annealing treatment at 900° C. for 1 minute under the atmosphere of an oxygen partial pressure of 0.1 Pa to diffuse Hf in the silicon oxide film. Thereby, a gate insulating film 503 having a laminated structure of the silicon oxide film and the HfSiO film was formed. Subsequently, the silicon substrate 501 on which the gate insulating film 503 was formed was delivered to a chamber 603 without letting the substrate get exposed to the atmosphere. Then, in the processing apparatus which is shown in detail in FIG. 2, with the mixing ratio of a nitrogen gas volume flow rate and an argon gas volume flow rate adjusted to satisfy nitrogen gas/ (nitrogen gas+argon gas)≧0.05 and by use of a Ti target, a TiN film 504 was deposited on the substrate with a thickness of 10 nm by a PVD method. By forming successively a combination of an insulating film and a gate electrode by use of the method for forming a gate electrode according to the present invention, it is possible to suppress entry of impurities into the interface between the insulating film and the gate electrode, and to obtain the desired leak current and effective work function. Next, after a silicon layer 505 of 20 nm thickness was formed, part of the resultant substrate was processed into a gate electrode by the lithography technology and the RIE technology, and thereafter ion implantation was performed to form self-alignedly an extension diffusion region 506 with the gate electrode used as a mask, as shown in FIG. 7B. Furthermore, as shown in FIG. 7C, a silicon nitride film and a silicon oxide film were sequentially deposited, which were then etched back to form a gate sidewall 507. In this state, ion implantation was performed again and, through activation annealing, a source/drain diffusion layer 508 was formed. As a result of evaluating electric characteristics of the manufactured element, it was confirmed that an effective work function suitable for p-type MOSFETs (4.9 eV or higher) was obtained without a deterioration of EOT and leak current.

Moreover, it was confirmed that the same effect was obtained from a HfSiO film deposited by a CVD method as the gate insulating film. Further, it was confirmed that the same effect was obtained when a HfSiON film formed by depositing HfSiO and then subjecting the deposited HfSiO to a radical nitriding treatment was used as the gate insulating film. Furthermore, it was confirmed that the same effect was obtained when a material containing Zr selected from the group consisting of ZrSiO, ZrSiON, HfZrSiO, and HfZr- SiON was used as the gate insulating film. As described above, it was confirmed that the effect of the present invention was obtained also in MOSFET elements formed of the MIPS- type gate electrode in the embodiment.

SECOND EXAMPLE

Figure 9A:
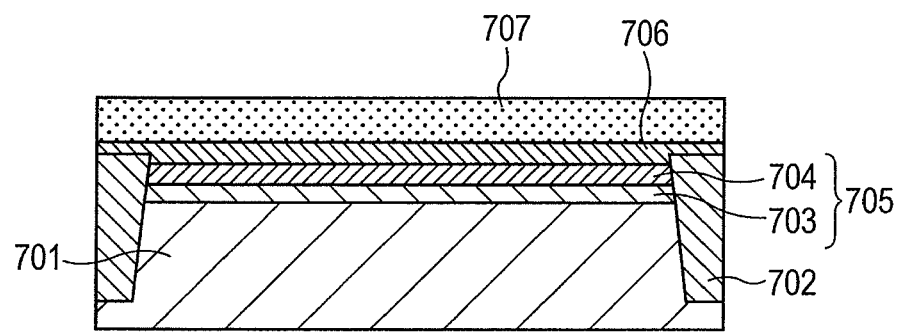
FIG. 9A is a view showing a process of manufacturing a semiconductor device according to a second example of the present invention.

A second example of the present invention will be described below with reference to the drawings. FIGS. 9A to 9G are diagrams showing a process of a method for manufacturing a semiconductor device according to the second example of the present invention. First, as shown in FIG. 9A, an element isolation region 702 was formed on a surface of a silicon substrate 701 by the STI technology. Subsequently, a silicon thermally-oxidized film 703 of 1.0 nm thickness was formed by a thermal oxidation method on the surface of the silicon substrate 701 subjected to element isolation, and thereafter a high-permittivity film 704 made of $HfO_2$ was formed with a thickness of 2.0 nm by a CVD method, an ALD method, or a sputtering method, whereby a high-permittivity gate insulating film 705 containing the high-permittivity film was formed.

Next, a titanium nitride film 706 of 2.0 nm thickness was formed on the high-permittivity gate insulating film 705 by the same method as in the first example, and then a silicon film 707 of 100 nm thickness was formed by the CVD method or the sputtering method.

Figure 9B:
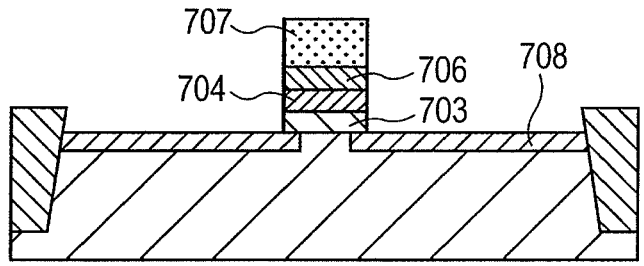
FIG. 9B is a view showing the process of manufacturing a semiconductor device according to the second example of the present invention.
Figure 9C:
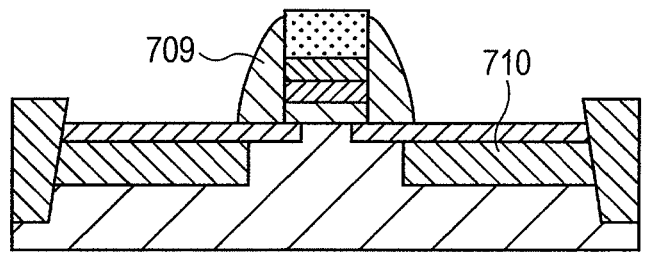
FIG. 9C is a view showing the process of manufacturing a semiconductor device according to the second example of the present invention.
Figure 9D:
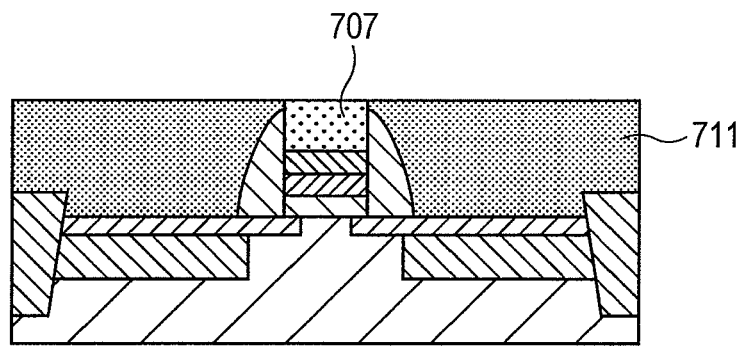
FIG. 9D is a view showing the process of manufacturing a semiconductor device according to the second example of the present invention.
Figure 9E:
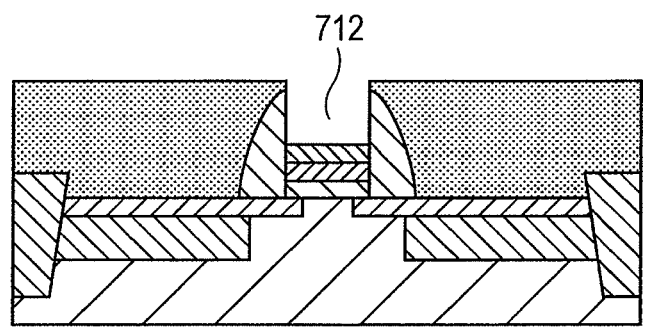
FIG. 9E is a view showing the process of manufacturing a semiconductor device according to the second example of the present invention.

Subsequently, as shown in FIG. 9B, the high-permittivity gate insulating film 705, the titanium nitride film 706, and the silicon film 707 were processed by the lithography technology and the RIE technology, and then ion implantation was performed to form an extension diffusion region 708. In other words, source and drain regions were formed with at least the high-permittivity gate insulating film 705, the titanium nitride film 706, and the silicon film 707 used as a mask. Further, as shown in FIG. 9C, a silicon nitride film or a silicon oxide film was deposited by the CVD method, which was then etched back to form a sidewall 709. In this state, ion implantation was performed again and, through activation annealing, a source/drain diffusion layer 710 was formed. Next, as shown in FIG. 9D, an interlayer insulating film 711 formed of a silicon oxide film, a silicon nitride film, or the like was formed on the substrate made by the CVD method. Then, the upper surface of the interlayer insulating film 711 was polished and flattened by a CMP (Chemical Mechanical Polishing) method to expose the silicon film 707 as shown in FIG. 9D. Thereafter, as shown in FIG. 9E, the silicon film 707 was removed by wet etching or dry etching to form a trench structure 712.

Figure 9F:
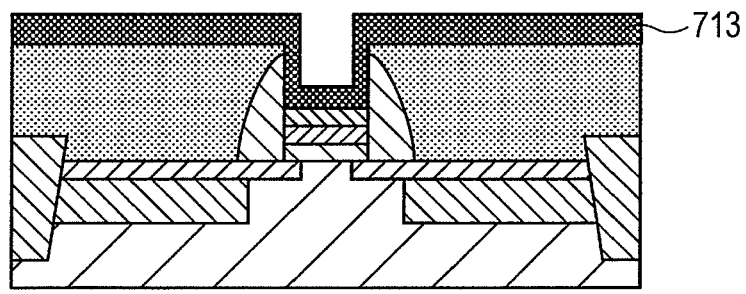
FIG. 9F is a view showing the process of manufacturing a semiconductor device according to the second example of the present invention.
Figure 9G:
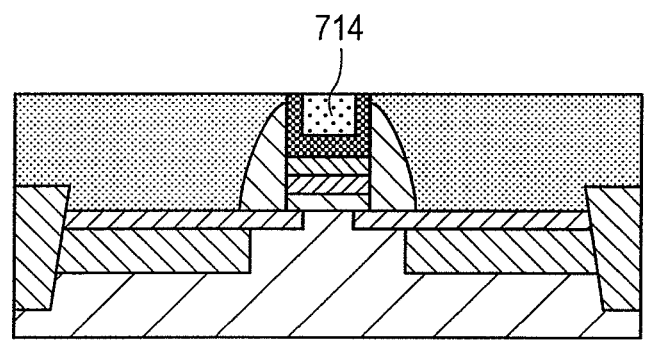
FIG. 9G is a view showing the process of manufacturing a semiconductor device according to the second example of the present invention.
Figure 10:
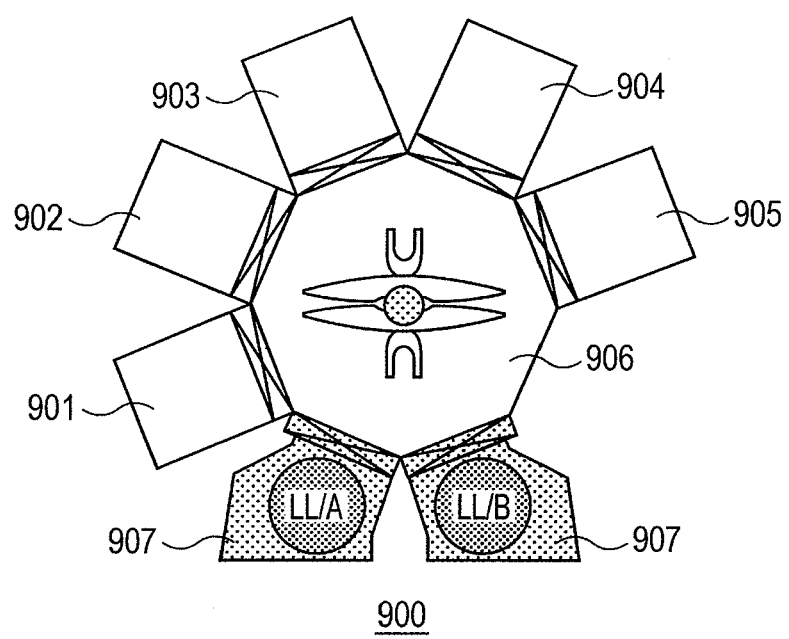
FIG. 10 is a schematic view showing an apparatus for carrying out part of the process of each of the first and second examples of the present invention.

Next, as shown in FIG. 9F, by use of a cluster tool of FIG. 10 employing the sputtering method according to the embodiment of the present invention, the substrate having the trench structure 712 was delivered to a chamber 902, and there tantalum nitride was formed on the substrate. Subsequently, the substrate on which tantalum nitride was formed was delivered to a chamber 901 or 903 without letting the substrate get exposed to the atmosphere, and there a titanium nitride film was formed on the substrate to form a gate electrode 713 made of metal nitride. Thereafter, the substrate on which the gate electrode 713 was formed was delivered to a chamber 905 without letting the substrate get exposed to the atmosphere, and there the trench structure 712 was filled with a metal material used as a usual wiring material, such as W or Al, and then the filler was flattened by the etch-back or CMP technique to form a gate electrode 714 (FIG. 9G).

As a result of measuring the effective work function, EOT, and leak current characteristics of the manufactured element, it was confirmed that leak current value was reduced and an effective work function suitable for p-type MOSFETs (4.6 eV or higher) was obtained without increasing EOT by using the method for forming a metal nitride layer according to the present invention. Moreover, it was confirmed that the same effect was obtained when a HfSiO film was used as the high-permittivity gate insulating film.

THIRD EXAMPLE

A third example of the present invention will be described below with reference to the drawings. FIGS. 11A to 11F are diagrams showing a process of a method for manufacturing a semiconductor device according to the third example of the present invention. In this example, the "step of forming the trench structure" in the second example is carried out in each of a region for forming a n-type MOSFET being a first region and a region for forming a p-type MOSFET being a second region to form a metal gate electrode achieving an effective work function suitable for the corresponding MOSFET.

Figure 11A:
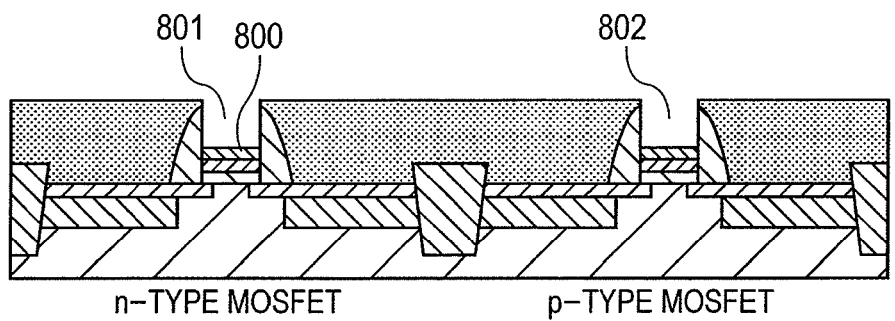
FIG. 11A is a view showing a process of manufacturing a semiconductor device according to a third example of the present invention.

As shown in FIG. 11A, trench structures 801 and 802 were formed in the first region for forming the n-type MOSFET and the second region for forming the p-type MOSFET, respectively, by using the same method as in the second example.

Figure 11B:
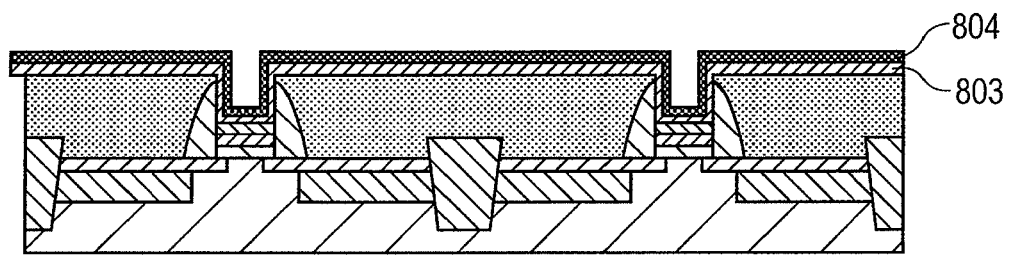
FIG. 11B is a view showing the process of manufacturing a semiconductor device according to the third example of the present invention.
Figure 11C:
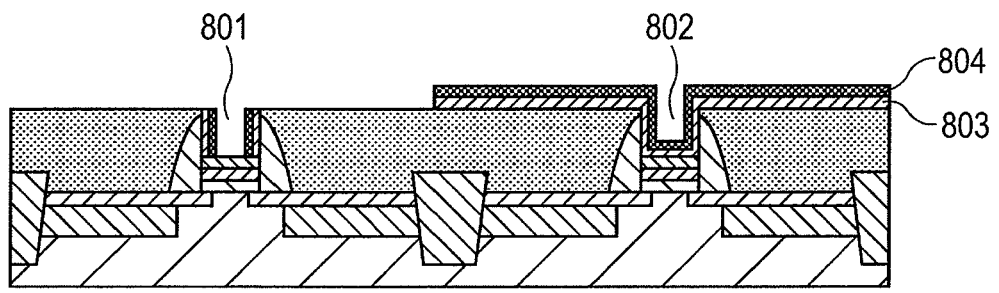
FIG. 11C is a view showing the process of manufacturing a semiconductor device according to the third example of the present invention.
Figure 11D:
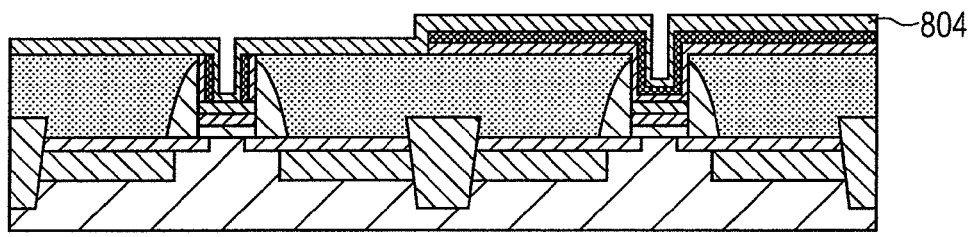
FIG. 11D is a view showing the process of manufacturing a semiconductor device according to the third example of the present invention.

Next, as shown in FIG. 11B, a tantalum nitride film 803 and a titanium nitride film 804 were formed to cover the inside of the trench structures, by using the sputtering method according to the present invention. Subsequently, part of the tantalum nitride film and the titanium nitride film constituting a bottom portion of the trench structure 801 in the first region for forming the n-type MOSFET were removed by using the lithography technology and the etching technology. In this example, the titanium nitride film was removed by wet etching by use of a mixed solution of sulfuric acid, hydrogen peroxide solution, and water, whereas the tantalum nitride film was removed by Ar plasma etching. Then, as shown in FIG. 11D, by use of the cluster tool of FIG. 10 employing the sputtering method according to the embodiment of the present invention, the substrate on which the titanium nitride film 804 was formed was delivered to the chamber 904, and there a metal alloy film 805 containing a titanium and aluminum alloy was formed on the substrate.

Figure 11E:
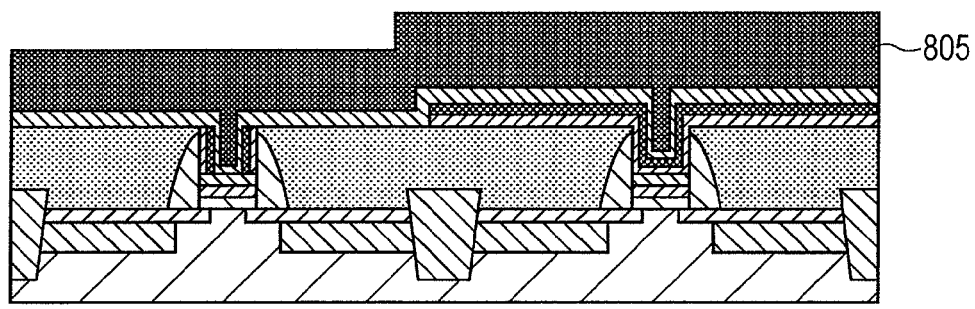
FIG. 11E is a view showing the process of manufacturing a semiconductor device according to the third example of the present invention.
Figure 11F:
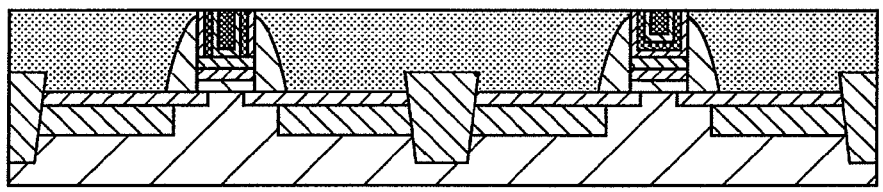
FIG. 11F is a view showing the process of manufacturing a semiconductor device according to the third example of the present invention.

Thereafter, as shown in FIG. 11E, the substrate on which the metal alloy film 805 was formed was delivered to the chamber 905 where film formation is carried out by using the sputtering method, and there a metal film 806 made of aluminum was formed to fill the insides of the trench structures and thereafter flattened by using the CMP technique, whereby a structure shown in FIG. 11F was formed. Note that, by setting the substrate temperature in a range of 300° C. to 400° C. in the step of forming the metal film made of aluminum, aluminum contained in the metal alloy film 805 made of titanium and aluminum is diffused in the titanium nitride film 800 at least in the region for forming the n-type MOSFET, whereby an effective work function suitable for n-type MOSFETs can be achieved. On the other hand, in the region for forming the p-type MOSFET, the tantalum nitride film and the titanium nitride film suppress diffusion of aluminum, whereby an effective work function suitable for p-type MOSFETs can be maintained.

As a result of measuring the effective work function, EOT, and leak current characteristics of the manufactured element, it was confirmed that leak current value was reduced and effective work functions suitable for the respective MOSFETs (4.4 eV or lower for n-type MOSFETs and 4.6 eV or higher for p-type MOSFETs) were obtained without increasing EOT by using the method for forming a metal nitride layer according to the present invention. Moreover, it was confirmed that the same effect was obtained when a HfSiO film was used as the high-permittivity gate insulating film.

What is claimed is:

1. A method for manufacturing a semiconductor device comprising the steps of:
preparing a substrate on which an insulating film having a relative permittivity higher than that of a silicon oxide film is formed; and
depositing a metal nitride film as a metal gate electrode on the insulating film, wherein
the step of depositing the metal nitride film is a step of sputtering deposition in an evacuatable process chamber by use of a metal target and a cusp magnetic field formed over a surface of the metal target by a structure in which a plurality of magnet pieces are arranged as grid points in such a grid form that adjacent magnet pieces have their polarities reversed from each other, wherein the metal nitride film is formed by introducing a gas containing a nitrogen gas into the process chamber and forming plasma of the nitrogen by the cusp magnetic field.

2. The method for manufacturing a semiconductor device according to claim 1, wherein the metal nitride film contains at least one of metal elements selected from the group consisting of Ti, Ta, W, and Al.

3. The method for manufacturing a semiconductor device according to claim 1, wherein, in the step of depositing the metal nitride film, a pressure is set in a range between 2 Pa and 100 Pa.

4. The method for manufacturing a semiconductor device according to claim 1, wherein
the gas further includes an argon gas, and
in the step of depositing the metal nitride film, a volume flow rate ratio of nitrogen/(nitrogen+argon) in film deposition is 0.05 or higher.

5. The method for manufacturing a semiconductor device according to claim 1, wherein
a high-frequency power supply capable of supplying high-frequency power via a matching circuit to an electrode on which the metal target is placed is connected to the electrode, and
a frequency of the high-frequency power to be supplied to the electrode is in a range of 10 MHz to 100 MHz.

6. The method for manufacturing a semiconductor device according to claim 5, wherein a DC power supply configured to supply a direct-current voltage is connected to the electrode, and the direct-current voltage is superimposed on the high-frequency power.

7. A method for manufacturing a semiconductor device comprising the steps of:
forming a high-permittivity insulating film on a semiconductor substrate;
forming a first metal nitride layer as a metal gate electrode on the high-permittivity insulating film;
forming a silicon layer on the first metal nitride layer;
forming a source region and a drain region in the semiconductor substrate with at least the high-permittivity insulating film, the first metal nitride layer, and the silicon layer used as a mask;
forming an interlayer insulating film on the semiconductor substrate in which the source region and the drain region are formed, and then removing part of the interlayer insulating film thereby to expose the silicon layer;
removing the silicon layer over the high-permittivity insulating film and thereby forming a trench structure; and
forming a second metal nitride layer in such a way as to cover an inside of the trench structure, wherein
at least one of the step of forming the first metal nitride layer and the step of forming the second metal nitride layer is a step of sputtering deposition in an evacuatable process chamber by use of a metal target and a cusp magnetic field formed over a surface of the target by a structure in which a plurality of magnet pieces are arranged as grid points in such a grid form that adjacent magnet pieces have their polarities reversed from each other, wherein the metal nitride film is formed by introducing a gas containing a nitrogen gas into the process chamber and forming plasma of the nitrogen by the cusp magnetic field.

8. A method for manufacturing a semiconductor device comprising the steps of:
forming a high-permittivity insulating film on a semiconductor substrate in a region for forming a first MOS transistor and a region for forming a second MOS transistor having a conductivity type opposite to that of the first MOS transistor;
forming a metal nitride layer as a metal gate electrode and a silicon layer sequentially on the high-permittivity insulating film;
forming source regions and drain regions in the semiconductor substrate with at least the high-permittivity insulating film, the metal nitride layer, and the silicon layer used as a mask;
forming an interlayer insulating film on the semiconductor substrate in which the source regions and the drain regions are formed, and then removing part of the interlayer insulating film thereby to expose the silicon layer;
removing the silicon layer over the high-permittivity insulating film and thereby forming trench structures;
forming a tantalum nitride film and a titanium nitride film sequentially in such a way as to cover insides of the trench structures;
removing part of the titanium nitride film and the tantalum nitride film covering a bottom portion of the trench structure in the region for forming the first MOS transistor;
forming an alloy layer containing titanium and aluminum in such a way as to cover the insides of the trench structures; and
forming an aluminum film on the alloy layer in such a way as to fill the insides of the trench structures, wherein
at least one of the metal nitride layer, the titanium nitride film, and the tantalum nitride film is formed by a sputtering method which is carried out with a gas containing nitrogen being introduced into an evacuatable process chamber, by use of a metal target, a cusp magnetic field formed over a surface of the target by a structure in which a plurality of magnet pieces are arranged as grid points in such a grid form that adjacent magnet pieces have their polarities reversed from each other, and plasma of the nitrogen formed by the cusp magnetic field.

* * * * *